(12) United States Patent
Walker

(10) Patent No.: US 10,720,769 B2
(45) Date of Patent: Jul. 21, 2020

(54) FAULT DETECTION BASED ON AMOUNT OF PFC CORRECTION

(71) Applicant: HEWLETT PACKARD ENTERPRISE DEVELOPMENT LP, Houston, TX (US)

(72) Inventor: William James Walker, Houston, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 12 days.

(21) Appl. No.: 16/174,847

(22) Filed: Oct. 30, 2018

(65) Prior Publication Data
US 2020/0136372 A1   Apr. 30, 2020

(51) Int. Cl.
*H02M 7/00* (2006.01)
*H02H 7/125* (2006.01)
*H02M 1/42* (2007.01)

(52) U.S. Cl.
CPC ........ *H02H 7/1255* (2013.01); *H02M 1/4208* (2013.01)

(58) Field of Classification Search
CPC ............................ H02H 7/1255; H02M 1/4208
See application file for complete search history.

(56) References Cited

U.S. PATENT DOCUMENTS

2013/0249397 A1* 9/2013 Chandran ............ H05B 47/185
                                                      315/85

OTHER PUBLICATIONS

On Semiconductor, "Compensating a PFC Stage," 2009, pp. 1-47.
Tektronix, "Active Power Factor Correction Verification Measurements with an Oscilloscope," Apr. 2016, pp. 1-12.

* cited by examiner

*Primary Examiner* — Adolf D Berhane
*Assistant Examiner* — Afework S Demisse
(74) *Attorney, Agent, or Firm* — Hewlett Packard Enterprise Patent Department

(57) ABSTRACT

An example power supply for supplying electrical power to an electronic device includes an AC to DC converter, power factor correction (PFC) circuitry, and a controller. The AC to DC converter is configured to convert an input AC power signal into a DC power signal. The PFC circuitry is configured to correct a power factor of the DC power signal. The controller is configured to monitor an amount of correction ($\varphi$) being applied to the DC power signal by the PFC circuitry and to shut down supply of power to the electronic device in response to $\varphi$ being within a first threshold of zero degrees for a second threshold amount of time.

18 Claims, 6 Drawing Sheets

FAULT DETECTION BASED ON AMOUNT OF PFC CORRECTION

BACKGROUND

A power supply is a device that can provide power to an electronic device, such as a server. For example, a power supply may convert power from a form that is not suitable for the electronic device (such as an alternating current (AC) power signal) into a form that is suitable for the electronic device (such as direct current (DC) power signal having a specific voltage).

Some power supplies include power factor correction (PFC) circuits that correct the power factor of the power drawn by the power supply. In particular, active PFC circuits work to ensure that the waveforms of the current drawn by the power supply and the voltage of the input AC power signal are congruent and in-phase—that is, that the phase difference between the current and voltage waveforms is as close to zero as possible and both waveforms have similar shapes (i.e., both are sinusoidal). For example, a PFC circuit may correct the power factor by using active circuitry to change the waveform of the current that is drawn to make it sinusoidal and reduce the phase difference.

DETAILED DESCRIPTION

Figure 1:
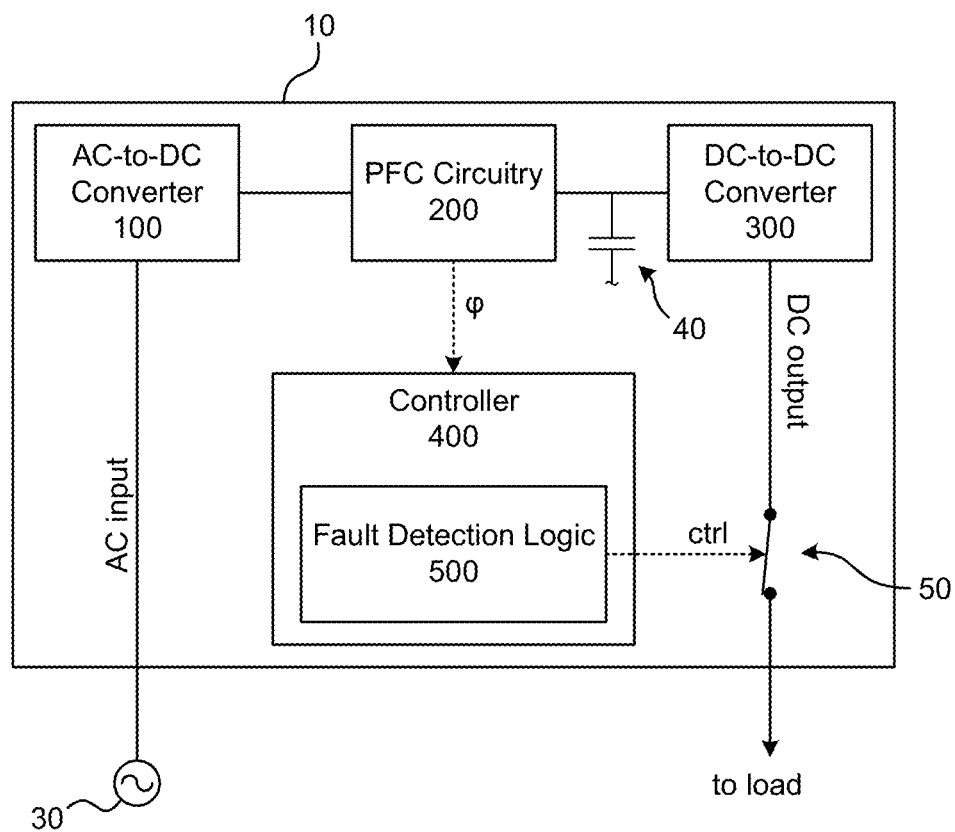
FIG. 1 is a block diagram illustrating an example power supply.

Electrical systems, such as servers, may be susceptible to electrical faults that can degrade performance and damage the system. For example, a short may occur in a system as a result of failure of a component that was not manufactured up to specification or has some other flaw. Such a short could result in the system drawing too much current (referred to as an overcurrent condition), which may result in excessive heat generation that may cause components to fail and otherwise damage the system. In some cases, one fault may lead to other faults in a cascading fashion, multiplying the damage to the system. In extreme cases, fire or other severe thermal events may occur, resulting in the total destruction of the electrical system and possibly neighboring devices.

Accordingly, power supplies and electrical devices may include various countermeasures to prevent such faults and/or to mitigate damage when such faults occur. For example, fuses and circuit breakers may be used to prevent too much current from flowing through certain lines.

However, existing countermeasures for overcurrent conditions may have some deficiencies. For example, it may not be possible, or may be too costly, to prevent all overcurrent conditions using fuses, as different parts of the system may have different current ratings and thus may require different fuses to be distributed throughout the system. For example, a fuse at the input of the power supply would need to allow sufficient current to pass through for the entire system, but this level of current may be more than enough to fry individual down-stream components, and a fault occurring at the down-stream components may never trip the fuse at the input.

Thus, disclosed herein are example power supplies that may counteract overcurrent conditions while overcoming some of the difficulties noted above. In particular, in example power supplies described herein, the amount of correction being applied by the PFC circuit is monitored, and if the amount of correction trends towards zero this is treated as an indication that a fault, such as a short circuit, has occurred somewhere in the electrical system. In response to such an event, the power supply may isolate the input power from the electrical device to prevent further current from flowing through the short, thus preventing thermal damage from occurring.

More specifically, in some examples, if the amount of correction being applied by the PFC is within a threshold amount of zero for more than a threshold amount of time, then this is treated as an indication of a fault. This may be referred to as a PFC fault detection condition.

In some examples, the PFC fault detection condition being satisfied may be sufficient on its own to trigger the preventive countermeasures (e.g., shutting down power). However, in some examples additional fault detection conditions may also be considered before triggering the preventive countermeasures. For example, an average current fault detection condition may be used in connection with the PFC fault detection condition, where the average current fault detection condition is satisfied when the current being drawn by the system exceeds a moving average of the current by a threshold amount.

The examples disclosed herein are able to detect certain faults, in particular short circuits, based on the following principles discovered by the inventor. Most electrical systems, in particular servers, are not purely resistive when operating normally, and as a result there will almost always be some phase difference between the input current and the input voltage prior to PFC correction. In other words, for most servers that have an active PFC, the PFC will always be applying a non-zero amount of correction when everything is operating normally. However, when there is a short circuit somewhere in the system, current may flow through the circuit in an essentially resistive manner, which has the effect of making the overall load appear to be more-or-less purely resistive. This results in the phase difference going to zero (a purely resistive load generally has zero phase difference), which results in the amount of power factor correction that is applied by the PFC going to zero. Thus, combining the forgoing principles, when there is a short circuit somewhere in the system, the amount of correction that is applied by the PFC circuit will go towards zero. Accordingly, such short circuits can be detected by monitoring the amount of correction applied by the PFC.

An advantage of the examples disclosed herein is that they may be able to handle fault conditions that a fuse would not handle well. Specifically, examples disclosed herein may be able to detect fault conditions by monitoring the amount of correction applied by the PFC even when the current being drawn is relatively low (compared to a max current the system is rated to draw). This may allow the system to be shut down before too much damage is caused by the fault. In contrast, protective measures that rely on the absolute amount of current being drawn (such as a fuse) trigger only when the current becomes sufficiently high, and at that point substantial damage may already be done to the system.

For example, if the power supply is running at 20% of its rated load and a short develops, the spike in total current flowing through the supply resulting from the short might not bring the total current being drawn over the rated max current for the supply. Thus, any protective measures (such as a fuse) that are based on the total current flowing through the supply would not detect or mitigate that fault. However, that fault may still be dangerous even though the total current flowing through the supply is less than its rated max current, since the local current running through the short may still be enough to produce some serious damage. Thus, it is advantageous to be able to detect and mitigate such localized overcurrent conditions even when the aggregate current flowing through the supply is less than its max rating.

Another advantage of the examples disclosed herein is that they may allow expensive countermeasures, such as e-fuses, to be omitted, thus saving on both the cost of the power supply and the space within the power supply occupied by those devices.

Detailed examples of the aforementioned techniques and devices will now be described with reference to the Figures.

1. Example Power Supply

Example power supplies described herein are configured to convert an input AC power signal into a DC power signal, and provide the DC power signal to an electronic device, such as a server or other computing device. In addition, the example power supplies described herein include PFC circuitry to apply power factor correction, and a controller that is configured to perform the operations described herein pertaining to detecting fault conditions by monitoring the amount of correction being applied by the PFC circuitry.

It should be understood that there are numerous ways that a power supply may be configured to convert AC input power to DC output power, including configurations having different types and/or numbers of converters, as well as different supporting components such as filters, correction circuitry, transformers, etc. FIG. 1 illustrates one specific example of a power supply, but it should be understood that the techniques described herein for fault detection based on the amount of PFC correction could be implemented using any other configuration of a power supply as long as it includes active PFC circuitry.

FIG. 1 illustrates the example power supply 10. The example power supply 10 includes an AC-to-DC converter 100, PFC circuitry 200 (also referred to as "the PFC"), a DC-to-DC converter 300, and a controller 400. In FIG. 1, power signals are illustrated using solid lines, while communications and/or control signals are illustrated using dashed lines. In FIG. 1, only half of the wiring path for the power signals is illustrated to simplify the diagram, but it should be understood that there would also be return paths (not illustrated) to complete the circuit.

The AC-to-DC converter 100 is configured to receive an input AC power signal from an AC power source 30, such as a power distribution unit and/or mains power supply line. The AC-to-DC converter 100 is configured to convert the input AC power signal into a DC power signal. There are numerous types of AC-to-DC converters, and any type could be used as the AC-to-DC converter 100. For example, the AC-to-DC converter 100 may include a bridge rectifier. The AC-to-DC converter 100 may also include additional components, such as a filter for filtering the input AC power signal, a capacitor to receive the converted power signal, etc.

The PFC 200 is configured to apply power factor correction to the power drawn by the power supply 10. In the illustrated example, the PFC 200 receives the signal that is output by the AC-to-DC converter 100, applies power factor correction, and outputs a corrected DC power signal to the DC-to-DC converter 300 (for example, via a bulk storage capacitor 40). The PFC 200 corrects the power factor by altering the waveform of the current that is drawn from the AC power source 30 ($I_{in}$) such that the current waveform is sinusoidal and the phase difference between $I_{in}$ and the voltage of the AC input signal ($V_{in}$) is zero (or as close as possible). For example, the PFC 200 may include a boost converter, and may alter the waveform of the current $I_{in}$ by modulating a duty cycle of a signal that controls a switch of the boost converter.

The correction applied by the PFC circuitry 200 may be controlled by a PFC controller. For example, if the PFC circuitry 200 uses a boost converter to modify the current waveform, then the signal that controls the switch of the boost converter may be generated by the PFC controller.

In some examples, the PFC controller may be distinct from the main controller of the power supply 10. For example, the PFC controller may be integrated into the PFC circuitry 200. For example, the PFC controller may be provided as a discrete integrated circuit (IC); for example, commercially available PFC controller ICs may be used as the PFC controller.

In other examples, the PFC controller may be part of the main controller of the power supply (e.g., the controller 400). For example, the controller 400 may include PFC control logic (not illustrated) that acts as the PFC controller and executes operations to control the PFC 200, with the logic comprising any combination of processor(s) executing instructions and dedicated hardware such as ASIC(s).

The DC-to-DC converter 300 may convert the signal output by the PFC circuitry 200 to a desired voltage for the electronic device, and supply the converted DC output signal to the electronic device. There are numerous types of DC-to-DC converters, and any type could be used as the DC-to-DC converter 300. For example, the DC-to-DC converter 300 may include a switch-mode DC-DC converter.

The controller 400 may be configured to perform the operations described herein, such as the operations of processes 1000-1020 that are described in section 2 below with reference to FIGS. 2-4. In some examples, the controller 400 may be a main controller of the power supply 10, and may control other operations of the power supply 10 besides the operations described herein. In other examples, the controller 400 may be separate from the main controller of the power supply 10; for example, the controller 400 may be a special purpose controller. In either case, the controller 400 may include fault detection logic 500. The fault detection logic 500 may include a processor that is to execute stored instructions to perform the operations described herein, dedicated hardware that is configured to perform the operations described herein, or any combination of these.

In particular, the fault detection logic 500 may be configured to monitor the amount of correction applied by the PFC 200 ($\varphi$), and, when $\varphi$ is within a threshold P of zero for a threshold T amount of time (the "PFC fault detection condition"), the fault detection logic 500 may treat this as an indication of a fault and respond accordingly. For example, in response to the PFC fault detection condition being satisfied, the fault detection logic 500 may act to shut down the supply of power through the power supply 10. The controller 400 may shut down supply of power by, for example, sending out control signals (ctrl) that open one or more switches 50 to break the circuit, or by any other convenient method. The fault detection logic 500 is described in greater detail in section 3 below.

In some examples, the amount of correction that is applied ($\varphi$) may correspond to a phase shift that has actually been applied by the PFC circuitry—i.e., the number of degrees the phase of the current waveform has been shifted as a result of the power factor correction from what it otherwise would have been without the power factor correction.

In some examples, $\varphi$ may correspond to the phase difference between the uncorrected current waveform and the voltage waveforms—i.e., the phase difference that would have been present if the power factor correction had not been applied. Although such a phase difference may not be precisely equal to the amount of correction that was actually applied by the PFC 200 (since no PFC circuit is perfect), such a phase difference may be treated as an estimate of the amount of correction that was performed, and thus may be used as $\varphi$.

In some examples, $\varphi$ may be obtained by the controller 400 from the PFC controller. For example, the PFC controller may explicitly determine and output a value to the fault detection logic 500 that is indicative of an amount of correction being applied. The value output by the PFC controller may be equal to $\varphi$, or may be a value from which the fault detection logic 500 can derive $\varphi$. For example, in cases in which the PFC circuitry 200 includes a boost converter, the fault detection logic 500 may be able to derive $\varphi$ from information about the duty cycle pattern of the control signal of the switch in the boost converter.

In other examples, $\varphi$ may be derived by the controller 400 by analyzing the signals in the circuit. For example, the controller 400 may monitor the supply input power $P_{in}$ and output power $P_{out}$ and estimate an output efficiency by calculating $P_{in}/P_{out}-E$, where E is an efficiency factor E. The output efficiency calculated in this way corresponds to the phase angle shift $\varphi$.

Although FIG. 1 illustrates one switch 50 that is located between the DC-to-DC converter 300 and the electronic device, this is merely an example and one or more switches 50 could be located anywhere in the flow path of the power signal to break the circuit. Furthermore, a switch 50 is just one possible way to shut down the supply of power, and any other method of shutting down the supply of power could be used. For example, one or both of the converters 100, 300 may be capable of shutting down the supply of power responsive to a command from the controller 400.

In FIG. 1, the PFC 200 is shown as being between the AC-to-DC converter 100 and the DC-DC converter 300, but this is just one possible configuration. In other examples, the PFC 200 may be located elsewhere in the power supply 10.

In FIG. 1, various components, such as filters, capacitors, transformers, correction circuitry, etc. are omitted to simplify the diagram. However, in practice any number of such components may be included in the power supply 10 in any configuration.

Although FIG. 1 may give the appearance that the controller 400 is collocated with the other components, this need not necessarily by the case. In some examples, the controller 400 may be contained within a same chassis or device housing as the other components of the power supply 10. For example, when the controller 400 is implemented as the main controller of the power supply 10, it may generally (although not of necessity) be located within the main chassis or device housing as the rest of power supply 10. However, in other examples the controller 400 may be located outside of the chassis or housing of the power supply 10, and may communicate with the rest of the power supply 10 via a communications interface. For example, in some cases in which the controller 400 is not part of the main controller of the power supply 10, the controller 400 may be housed within a different device housing, such as in a multi-node system management unit (e.g., rack management unit).

2. Example Operations for Fault Detection Based on PFC Correction

Figure 2:
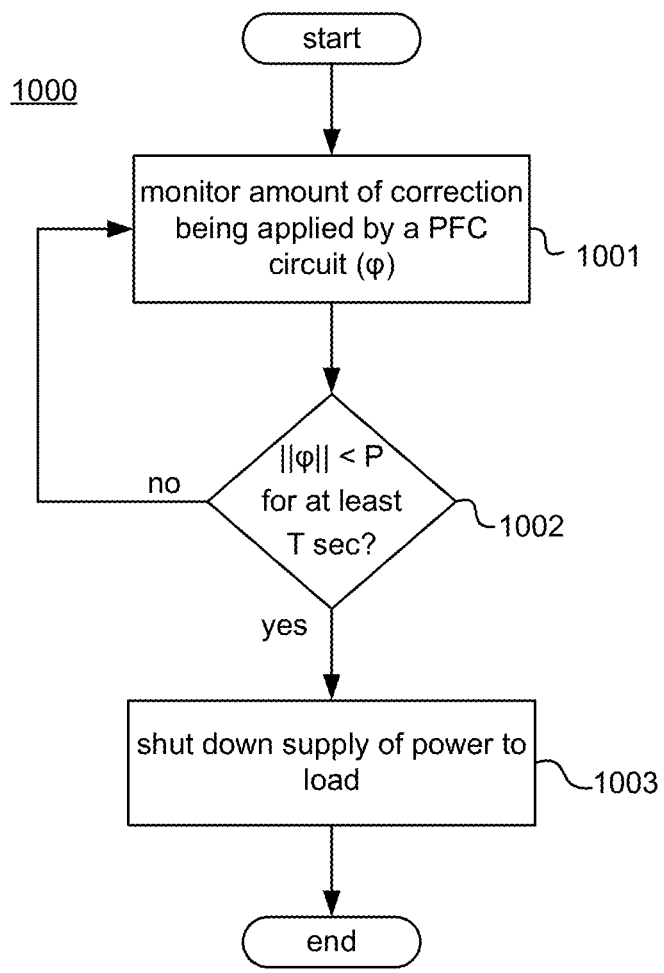
FIG. 2 is a process flow diagram illustrating a first example process of fault detection based on satisfaction of a PFC fault detection condition.
Figure 3:
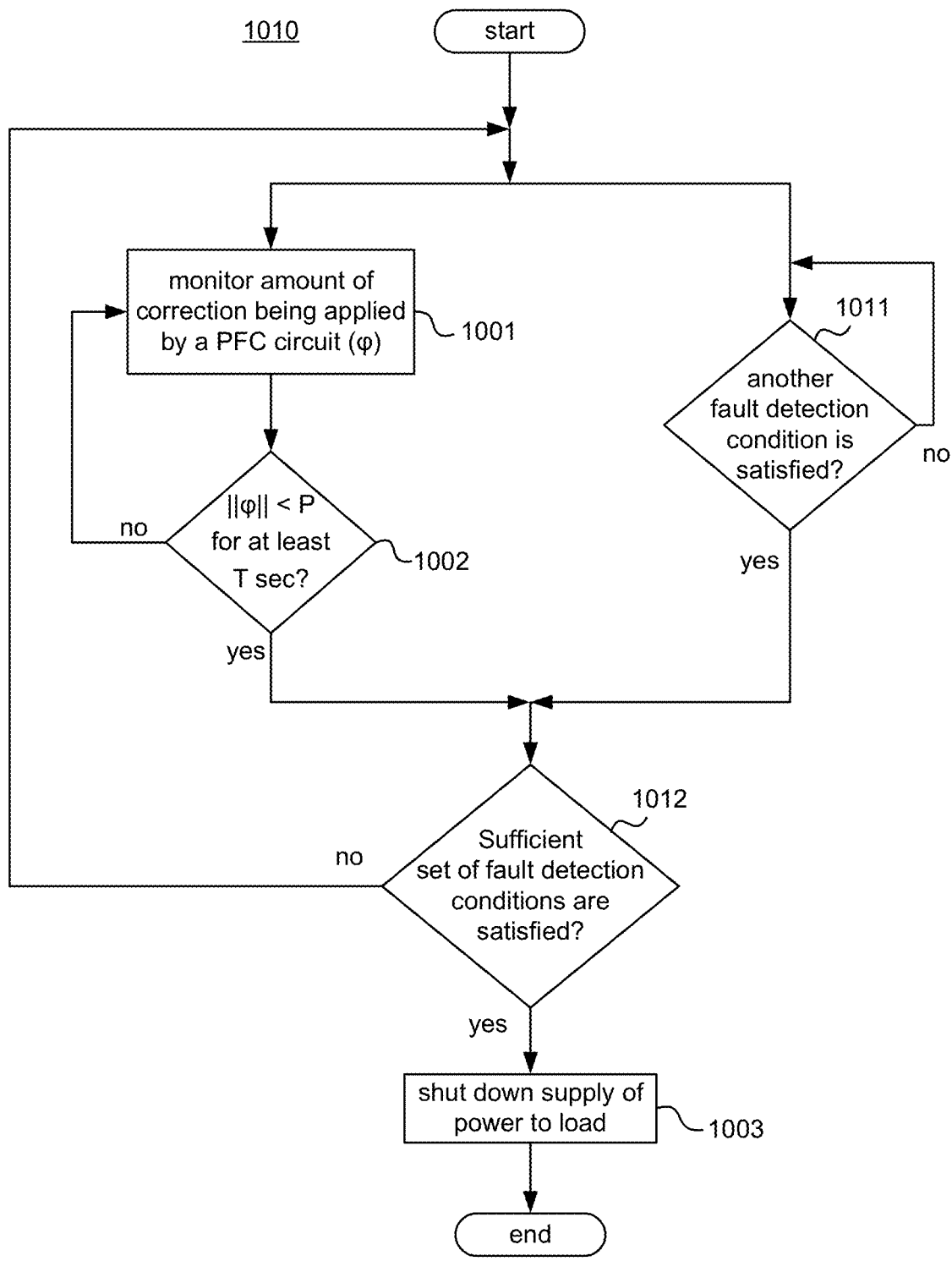
FIG. 3 is a process flow diagram illustrating a second example process of fault detection based on satisfaction of a PFC fault detection condition in which additional fault detection conditions are considered.
Figure 4:
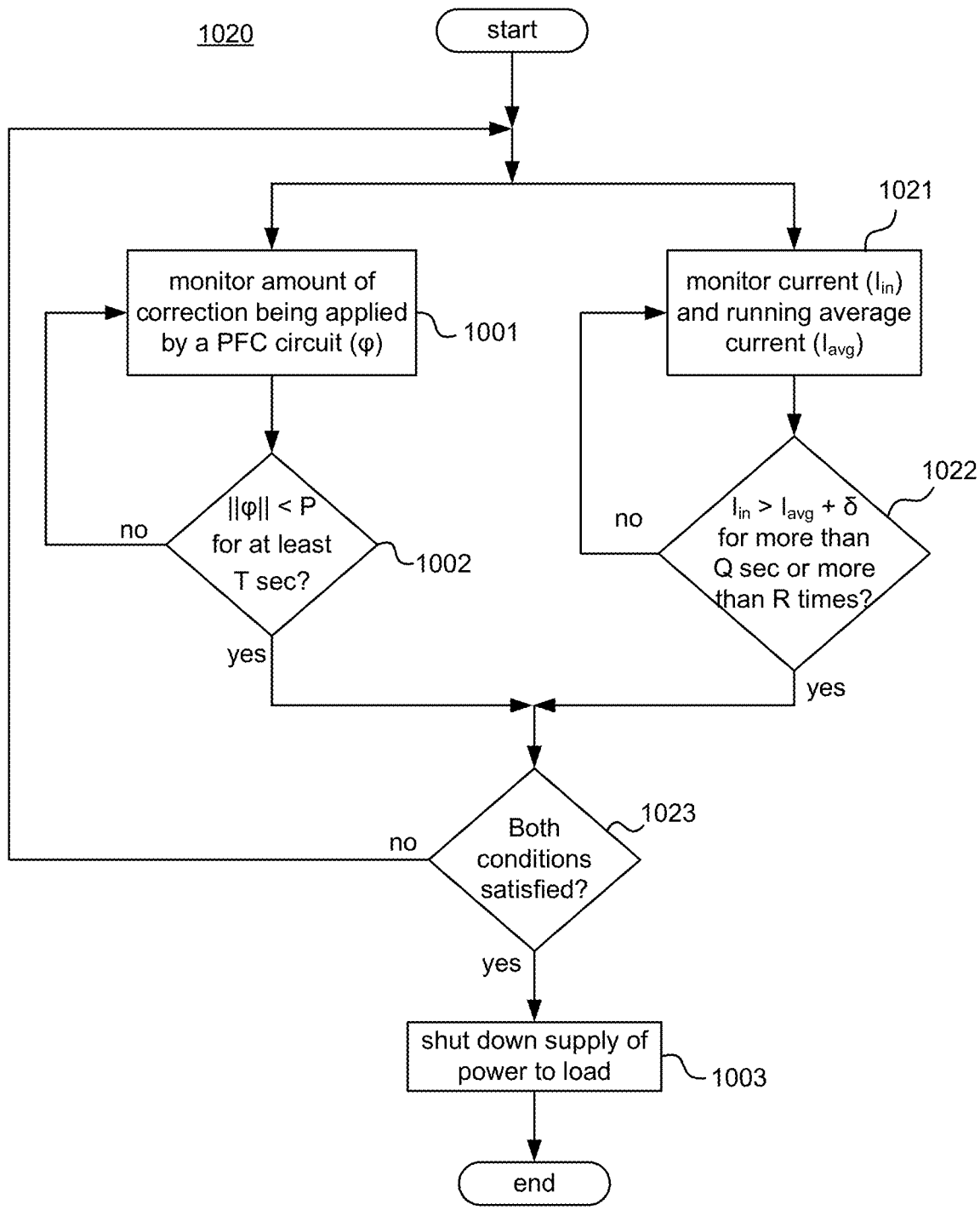
FIG. 4 is a process flow diagram illustrating a third example process of fault detection based on satisfaction of a PFC fault detection condition in which an average current fault detection condition is considered.

FIGS. 2-4 illustrate example processes 1000, 1010, and 1020 of detecting and responding to electrical faults based on the amount of correction being applied by PFC circuitry of a power supply (such as the PFC 200). The example processes 1000-1020 are related—specifically, the process 1010 is one particular example implementation of the process 1000 in which additional conditions besides the PFC fault detection condition are considered, and the process 1020 is one particular example implementation of the process 1010 in which the additional condition is specifically the average current fault detection condition. Thus, some operations are the same across the processes 1000-1020, and such operations will be described in detail only once to avoid duplicative description.

The example processes 1000, 1010, and 1020 may be performed by a controller of a power supply (e.g., the controller 400 of the power supply 10) containing logic that is configured to perform the operations (e.g., the fault detection logic 500). For example, one or more processors included in the controller may perform some or all of the processes 1000, 1010, and 1020 as a result of executing machine readable instructions corresponding to the operations described below (such as the fault detection instructions 503). As another example, one or more dedicated hardware devices (such as ASICs, FPGAs, CPLDs, etc.) included in the controller may perform some or all of the processes 1000, 1010, and 1020. The controller may be, but does not necessarily have to be, a main controller of the power supply.

2.1 Example Process 1000 for PFC-Based Fault Detection

FIG. 2 illustrates the example process 1000.

The process begins at block 1001, with the controller monitoring $\varphi$, which is the amount of correction being applied by the PFC circuit of the power supply. The value $\varphi$ may be obtained by the controller by any of the methods described above. For example, $\varphi$ may be obtained directly from the controller of the PFC circuitry, or may be derived from other information obtained from the PFC circuitry. The process then continues to block 1002.

At block 1002, the controller determines whether $\varphi$ is within a threshold P of zero (i.e., whether $\|\varphi\|<P$) for at least a threshold T seconds. The condition that is tested in block 1002 is referred to hereinafter as the PFC fault detection condition. If the PFC fault detection condition is satisfied, then the process continues to block 1003, and if not then the process loops back to block 1001. Thus, blocks 1001 and 1002 form a loop that continually monitors $\varphi$ until the PFC fault detection condition is satisfied. The controller may be configured to go through the loop periodically, such as, for example, every n clock cycles where n is a specified integer.

At block 1003, the controller shuts down the supply of power to the load (e.g., a computing device) responsive to the PFC fault detection condition of block 1002 being satisfied.

The threshold P is used in the PFC fault detection condition because it may be the case that φ does not actually go exactly to zero when there is a short circuit in the system. In other words, although the short circuit tends to make the load act as if it were mostly purely resistive, there may still be some reactive aspects of the load that prevent φ from becoming exactly zero. Thus, P should be set sufficiently high to ensure that actual short circuits are detected. However, setting P too high could result in false positives. Thus, preferably P is set to be higher than a highest value of ‖φ‖ that is expected to occur during a short circuit, and lower than a lowest value of ‖φ‖ that is expected to occur during normal operations of the system. These value may be determined experimentally, or by estimation. For example, in some examples P is set to around 2°.

The time element is included in the PFC fault detection condition to help exclude false positives. In particular, it is possible for φ to transiently pass through the neighborhood of zero during normal operations of the system. For example, if the load is predominantly capacitive at one point and then the load changes to being predominantly inductive (e.g., because a bunch of fans have been started up in the server), φ will change from a negative value (when the load is capacitive) to a positive value (when the load is inductive) and will pass through zero as part of the change. Such transient passes through the neighborhood of zero ideally should not trigger the PFC fault detection condition. Thus, preferably T is set to be just a little higher than a longest amount of time that is expected for a transient crossing through the neighborhood of zero as part of normal operations. This value may be determined experimentally, or by estimation. For example, in some examples T is set to around 10 ms.

The controller may determine whether the PFC fault detection condition is satisfied at block 1002 by, for example, the following. The controller may check whether ‖φ‖<P and if so then controller starts a timer if one is not already running. If ‖φ‖<P is not satisfied, then no timer is started and the timer may be turned off if it was running from a previous test period. Thus, the timer is turned on the first time that ‖φ‖<P is satisfied and continues to stay on through successive test periods until ‖φ‖<P is not satisfied. Thus, the present value of the timer indicates how long φ has been continuously within P of zero since the last time φ entered that range. Thus, if ‖φ‖<P and if the timer is already running, then the controller may check whether the timer is equal to or greater than T, and if so then the PFC fault detection condition is satisfied. If the timer is less than T, then the timer is kept running until the next testing period.

Although FIG. 1 illustrates just the PFC fault detection condition, it should be understood that the decision to shut down the supply of power to the load may also be conditioned on satisfaction of other conditions. Specifically, FIG. 1 is intended to show that the shutting down of the supply of power in block 1003 is based on (conditioned on) the satisfaction the PFC fault condition of block 1002, but not necessarily that the supply of power is shut down every time that the condition of block 1002 is satisfied (since other conditions may also need to be satisfied).

Specifically, in some examples the satisfaction of the PFC fault detection condition of block 1002 may be a necessary and sufficient condition for shutting down the supply of power in block 1003. In other words, in such examples, the supply of power is shut down in block 1003 if and only if the condition of block 1002 is satisfied, without considering other conditions.

In other examples, the satisfaction of the PFC fault detection condition of block 1002 may be a necessary but not sufficient condition for shutting down the supply of power. In other words, in such examples, the supply of power is shut down in block 1003 if and only if the PFC fault detection condition and some other condition are both satisfied. For example, the other condition that may need to be satisfied may be the average current fault detection condition that is described in greater detail below.

In other examples, the satisfaction of the PFC fault detection condition of block 1002 may be a sufficient condition but not a necessary condition for shutting down the supply of power in block 1003. In other words, in such examples, the supply of power is shut down in block 1003 if either the PFC condition or some other condition is satisfied.

In other examples, the PFC fault detection condition may be part of a sufficient set of conditions. In other words, in such examples, the supply of power is shut down in block 1003 if a sufficient set of conditions is satisfied, with the PFC fault detection condition being one possible member of that set of conditions.

The processes 1010 and 1020 illustrated in FIGS. 3 and 4 illustrate two example implementations in which shutting down the supply of power is conditioned upon other conditions in addition to the PFC fault detection condition.

2.2 Example Process 1010 with Additional Conditions

FIG. 3 illustrates the process 1010, which is an example of how the process 1000 could be implemented with additional conditions being considered in addition to the PFC fault detection condition. The process 1010 includes blocks 1001-1003 from the process 1000, and adds the blocks 1011 and 1012.

In block 1011, the controller determines whether another fault detection condition, besides the PFC fault detection condition, is satisfied. If so, then the process continues to block 1012, and if not then the process loops back to check the condition of block 1012 again. Any condition may be checked in block 1012. For example, the condition of block 1011 may be the average current fault detection condition described below in reference to FIG. 4.

Although one instance of block 1011 is illustrated, in practice any number of additional conditions could be considered, each with a corresponding instance of block 1011.

In block 1012, the controller determines whether a sufficient set of fault detection conditions are satisfied. If so, then the process continues to block 1003, and if not then the process loops back and checks the conditions again. In some examples, all of the conditions that are tested may need to be satisfied in order to constitute a sufficient set. In other examples, a specific number of conditions, which may be less than all of the conditions tested, may need to be satisfied in order to constitute a sufficient set. In other examples, specific combinations of conditions may need to be satisfied in order to constitute a sufficient set. In other examples, any one of the conditions being satisfied constitutes a sufficient set.

One reason why it may be beneficial to consider additional conditions, besides the PFC fault detection condition, is to help reduce the incidence of false positives. In particular, even when the thresholds P and T are carefully set, it is still possible that a non-fault event may satisfy the PFC fault condition and trigger a shutdown. However, by requiring that another fault detection condition be satisfied in addition to the PFC fault condition in order to trigger a shutdown, such a false positive becomes even less likely.

2.3 Example Process 1020 with Average Current Condition

FIG. 4 illustrates the process 1020, which is an example of how the processes 1000 and 1010 could be implemented with average current fault detection condition being considered in addition to the PFC fault detection condition. The process 1020 includes blocks 1001-1003 from the process 1000, and adds the blocks 1021, 1022, and 1023.

Blocks 1021 and 1022 constitute a specific example of how block 1011 from the process 1010 may be implemented. In particular, blocks 1021 and 1022 illustrate how an average current fault condition may be tested, with the average current fault condition being a specific example of the "another condition" that is mentioned in block 1011 of the process 1010.

In block 1021, the current that the power supply draws from the AC source ($I_{in}$) is monitored, and a running average of the current ($I_{avg}$) is tracked. For example, $I_{in}$ values may be sampled periodically—for example every clock cycle—and the samples may be stored in a register. The values stored in the register may be fed to averaging logic periodically (e.g., every clock cycle) that determines an average of the values stored in the register. The register may store a finite number of values, with the oldest value being written over when a new value is stored (e.g., the register may be a circular buffer), and therefore the value $I_{avg}$ constitutes a moving average of the current, rather than a complete average. In other words, the value $I_{avg}$ indicates the average value of $I_{in}$ over a recent period of time. For example, if 64 values are stored in the register and $I_{in}$ is sampled every clock cycle, then $I_{avg}$ represents the average value of $I_{in}$ over the past 64 clock cycles.

In block 1022, the controller determines whether the present current $I_{in}$ exceeds the moving average $I_{avg}$ by more than a threshold $\delta$, or in other words whether $I_{in} > I_{avg} + \delta$. This condition may be referred to as the average current fault detection condition. If the average current fault detection condition is satisfied, then the process continues to block 1023, and if not the process loops back to block 1021 to check the condition again during the next testing period.

In some examples, the average current fault detection condition may further require that $I_{in}$ be greater than $I_{avg} + \delta$ for either more than a threshold Q amount of time or more than a threshold R number of times within a period. In other words, this thresholding ensures that the average current fault detection condition is triggered only when current is spiking repeatedly or is consistently high for more than just a brief blip, since such patterns are often seen when a short is developing and/or after one has fully developed. This can help to reduce false positives, since the current may occasionally have solitary spikes over $I_{avg} + \delta$ due to noise or other non-fault events. In some implementations, just one of the thresholds Q or R is considered, while in other implementations both thresholds Q and R may be considered. In some examples, Q equals 10 ms. In some examples, R equals 2 times within 3-5 sample periods. In some examples, R equals 3 times within 3-5 sample periods.

However, in some examples, the additional thresholding tests may be omitted from the average current fault detection condition, such that the condition is satisfied any time that $I_{in} > I_{avg} + \delta$ is satisfied. Although this may result in the average current fault detection condition being triggered occasionally by false positives, this result may be acceptable in some circumstances because the PFC fault detection condition would also need to be satisfied before a shutdown would occur, and thus the false positive triggering of the average current fault detection condition would have no detrimental effect. In other words, the PFC fault detection condition may act as a check on the average current fault detection condition to help avoid false positives, and vice versa.

In block 1023, the controller determines whether both conditions—the PFC fault detection condition of block 1002 and the average current fault detection condition of block 1022—are satisfied. If both conditions are satisfied, then the process continues to block 1003 and the supply of power is shut down. If either condition (or both) are not satisfied, then the process may loop back to test the conditions again during the next testing period. Thus, block 1023 is a specific example of block 1012 in which there are two conditions and both are necessary to constitute a sufficient set.

The threshold value b may be used to ensure that normal rises and falls in the amount of current being drawn responsive to changing load conditions do not trigger the condition. In some examples, b may be set by the controller automatically based on prior measured values of $I_{in}$ and/or $I_{out}$—for example, the difference between $I_{in}$ and $I_{out}$ may be tracked for a period of time during normal operation of the power supply and b may be set to equal the highest value of $I_{in} - I_{avg}$ during the tracking period The average current fault detection condition is designed to detect faults, such as short circuits, based on the recognition that there are generally current spikes, characterized by large and rapid (steep) increase in current, during development of a short. By comparing the present current to the moving average current, such spikes may be detected, since large rapid increases in current will cause $I_{in}$ to exceed $I_{avg}$ by more than $\delta$. In particular, although $I_{avg}$ does ultimately follow $I_{in}$, because $I_{avg}$ is a moving average over multiple sample periods, $I_{avg}$ will lag behind $I_{in}$ by multiple sample periods. Thus, if the magnitude of $I_{in}$ increases greatly over the course of one or a few sample periods, $I_{in}$ will be greater than $I_{avg} + \delta$ because the magnitude of $I_{avg}$ will not have had time to change yet. On the other hand, if the magnitude of $I_{in}$ increases by a small amount (e.g., less than $\delta$), then $I_{in}$ will not exceed $I_{avg} + \delta$. Furthermore, even if the magnitude of $I_{in}$ increases by a large amount (e.g., more than $\delta$), if it does so gradually (i.e., over the course of many sample periods), then $I_{in}$ will still probably not exceed $I_{avg}$ by $\delta$, since the gradual increase in current allows $I_{avg}$ to have sufficient time to begin rising along with $I_{in}$ so that the difference between $I_{in}$ and $I_{avg}$ never gets too large.

Importantly, the average current fault detection condition detects changes in the magnitude of the current, rather than the absolute magnitude of the current. Thus, even if $I_{in}$ stays well below the max rating, the average current fault detection condition may still be triggered if $I_{in}$ rises too much or too quickly. In other words, the average current fault detection condition can detect current spikes indicative of a fault even when the total current flowing through the supply is low. This is an advantage over protective measures that rely on the absolute amount of current being drawn (such as a fuse), since as noted above damaging faults can occur even when the total current being drawn is not overly large.

The process flow diagrams in FIGS. 2-4 and the descriptions herein are presented to aid the understanding of the example processes, but are not intended to be exhaustive descriptions thereof. For example, the example processes could include additional operations besides those illustrated in the Figures and described herein. As another example, the example processes could omit certain operations illustrated in the Figures and described herein. Furthermore, the operations are illustrated in a particular order for ease of description, but in practice some operations may be performed concurrently and/or in a different order than that illustrated. In addition, certain operations that were described separately for ease of understanding may, in practice, be performed together as part of a single operation.

3. Example Fault Detection Logic 500

Figure 5:
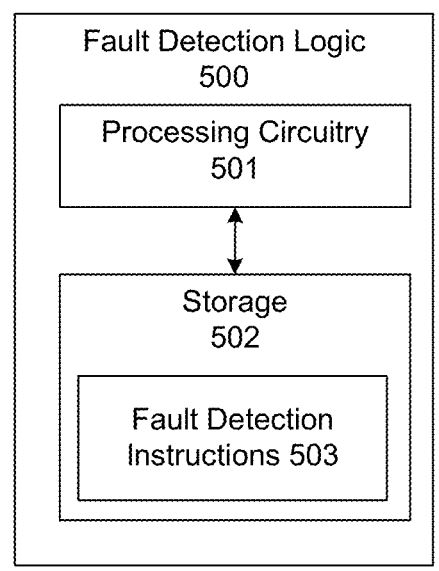
FIG. 5 is a block diagram illustrating an example fault detection logic.

FIG. 5 illustrates an example of the fault detection logic 500 of the controller 400 of the power supply 10. The fault detection logic 500 may be configured to perform some or all the operations described above in relation to the processes 1000-1020. The fault detection logic 500 may include processing circuitry 501 and, in some examples, storage 502 storing fault detection instructions 503.

The processing circuitry 501 may include a number of processors, dedicated hardware, or any combination of these. As used herein, a "processor" may include (or be virtualized from) any circuitry that is capable of executing machine-readable instructions, such as central processing units (CPUs), microprocessors, microcontrollers, digital signal processors (DSPs), application-specific instruction set processors (ASIPs), etc. As used herein, "dedicated hardware" means any physical device or component that is configured to perform a specific operation or set of operations (although not necessarily dependent on executing instructions), such as application-specific integrated circuits (ASICs), complex programmable logic devices (CPLD), field-programmable gate arrays (FPGAs), and so on. There is not necessarily a sharp line between processor and dedicated hardware, and some devices (such as FPGAs) could fall under either category.

Thus, when it is said that the fault detection logic 500 is configured to perform an operation, this means that either there is an instruction stored in the storage 502 that, when executed by a processor of the processing circuitry 501, will cause the processing circuitry 501 to perform the operation, or there is detected hardware in the processing circuitry 501 that is configured to perform the operating.

Accordingly, in some examples the processing circuitry 501 includes a processor and the storage 502 stores machine-readable instructions that, when executed by the processor, cause it to perform operations described herein, such as some or all of the operations of FIGS. 2, 3, and/or 4. For example, the storage may include the fault detection instructions 503.

In addition, in some examples the processing circuitry 501 includes dedicated hardware that is configured to perform (or support performance of) operations described herein, such as some or all of the operations of FIGS. 2, 3, and/or 4.

In some examples in which the processing circuitry 501 includes both processors and dedicated hardware, some or all of such additional hardware components may be integrated into a same integrated circuit as the processor. In particular, in some such examples, the processing circuitry 501 may be a system-on-chip (SoC).

As noted above, in some examples the fault detection logic 500 includes the storage 502, which may store the machine readable instructions. The storage 502 may include any non-transitory machine readable medium, which may include volatile storage media (e.g., DRAM, SRAM, etc.) and/or non-volatile storage media (e.g., PROM, EPROM, EEPROM, NVRAM, flash, hard drives, optical disks, etc.).

4. Example Machine Readable Media

Figure 6:
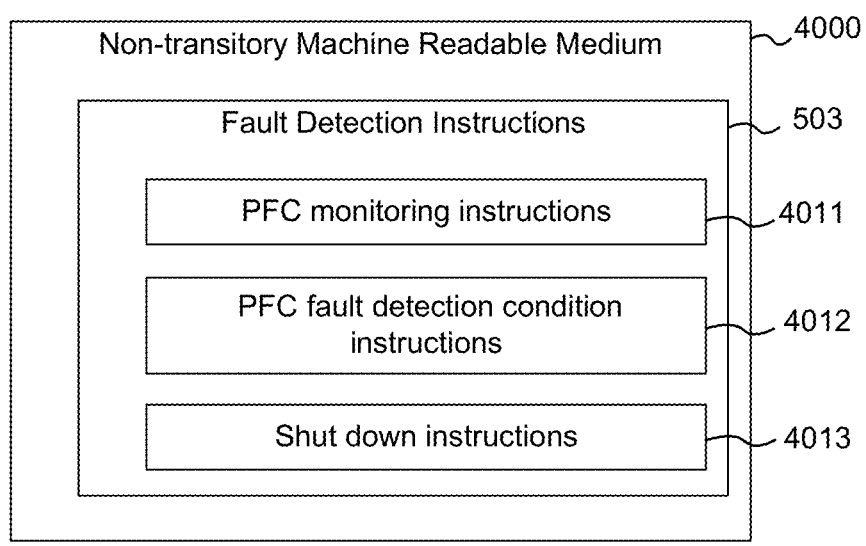
FIG. 6 is a block diagram illustrating an example non-transitory machine readable medium storing example fault detection instructions.

FIG. 6 illustrates an example non-transitory machine readable medium 4000 storing example fault detection instructions 503.

The example non-transitory machine readable medium 4000 may include any non-transitory machine readable medium, which may include volatile storage media (e.g., DRAM, SRAM, etc.) and/or non-volatile storage media (e.g., PROM, EPROM, EEPROM, NVRAM, flash, hard drives, optical disks, etc.).

The example fault detection instructions 503 may include machine readable, processor executable, instructions that are to, when executed by a processor, cause the processor to perform the operations described herein in relation to the process 1000 and FIG. 2. Specifically, example fault detection instructions 503 may include PFC correction monitoring instructions 4011, PFC fault detection condition instructions 4012, and shut down instructions 4013.

The PFC correction monitoring instructions 4011 may include instructions to monitor $\varphi$, which is the amount of correction being applied by the PFC circuit of the power supply (see block 1001).

The PFC correction monitoring instructions 4011 may include instructions to determine whether $\varphi$ is within a threshold P of zero for at least a threshold T seconds (see block 1002).

The shut down instructions 4013 may include instructions to shut down the supply of power to the load responsive to the PFC fault detection condition being satisfied.

The fault detection instructions 503 may also include additional instructions (not illustrated), such as instructions to perform the operations of the process 1010 or the operations of the process 1020 described above.

5. Definitions

As used herein, a "processor" may include any logic circuitry that is capable of executing machine readable instructions stored in a non-transitory machine-readable medium. For example, a "processor" may be, for example, a central processing unit (CPU), a microprocessor, a microcontroller, a digital signal processor (DSP), etc.

Throughout this disclosure and in the appended claims, occasionally reference may be made to "a number" of items. Such references to "a number" mean any integer greater than or equal to one. When "a number" is used in this way, the word describing the item(s) may be written in pluralized form for grammatical consistency, but this does not necessarily mean that multiple items are being referred to. Thus, for example, a phrase such as "a number of processors, wherein the processors . . . " could encompass both one processor and multiple processors, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form for grammatical consistency, but this does not necessarily mean that only one item is being referred to. Thus, for example, a phrase such as "a processor, wherein the processor . . . " could encompass both one processor and multiple processors, notwithstanding the use of the singular form.

Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

While the above disclosure has been shown and described with reference to the foregoing examples, it should be understood that other forms, details, and implementations may be made without departing from the spirit and scope of this disclosure.

What is claimed is:

1. A power supply for supplying electrical power to an electronic device, comprising:
    an AC to DC converter that is configured to convert an input AC power signal into a DC power signal;
    power factor correction (PFC) circuitry that is configured to correct a power factor of the DC power signal; and
    a controller that is configured to monitor an amount of correction ($\varphi$) being applied to the DC power signal by the PFC circuitry and to shut down supply of power to the electronic device in response to $\varphi$ being within a first threshold of zero degrees for a second threshold amount of time.

2. The power supply of claim 1,
wherein the controller is configured to
continually determine a moving average of the current drawn by the power supply and compare the moving average to a present current being drawn by the power supply; and
condition the shutting down of the supply of power on whether the present current being supplied to the electronic device exceeds the moving average by a third threshold amount.

3. The power supply of claim 1,
wherein the controller is configured to
continually determine a moving average of the current drawn by the power supply and compare the moving average to a present current being drawn by the power supply; and
condition the shutting down of the supply of power on whether the present current being supplied to the electronic device exceeds the moving average by a third threshold amount:
for more than a fourth threshold amount of time, or
more than a fifth threshold number of times within a specified period.

4. The power supply of claim 1,
wherein the second threshold is less than or equal to 10 ms.

5. The power supply of claim 1,
wherein $\varphi$ corresponds to an amount that a phase of a current waveform has been shifted by the PFC circuitry.

6. The power supply of claim 5,
wherein the first threshold is less than or equal to 2°.

7. A non-transitory machine readable medium storing processor executable instructions for fault detection in a power supply that converts an input AC power signal into a DC power signal for an electronic device and has power factor correction (PFC) circuitry that is configured to correct a power factor of the DC power signal, the instructions being to, when executed by a processor, cause the processor to:
    monitor an amount of correction ($\varphi$) being applied to the DC power signal by the PFC circuitry; and
    shut down supply of power to the electronic device in response to $\varphi$ being within a first threshold of zero degrees for a second threshold amount of time.

8. The non-transitory machine readable medium of claim 7,
wherein the instructions are to cause the processor to:
continually determine a moving average of the current drawn by the power supply and compare the moving average to a present current being drawn by the power supply; and
condition the shutting down of the supply of power on whether the present current being supplied to the electronic device exceeds the moving average by a third threshold amount.

9. The non-transitory machine readable medium of claim 7,
wherein the instructions are to cause the processor to:
continually determine a moving average of the current drawn by the power supply and compare the moving average to a present current being drawn by the power supply;
condition the shutting down of the supply of power on whether the present current being supplied to the electronic device exceeds the moving average by a third threshold amount:
for more than a fourth threshold amount of time, or
more than a fifth threshold number of times within a specified period.

10. The non-transitory machine readable medium of claim 7,
wherein the second threshold is less than or equal to 10 ms.

11. The non-transitory machine readable medium of claim 7,
wherein $\varphi$ corresponds to an amount that a phase of a current waveform has been shifted by the PFC circuitry.

12. The non-transitory machine readable medium of claim 11,
wherein the first threshold is less than or equal to 2°.

13. A method for fault detection in a power supply that converts an input AC power signal into a DC power signal for an electronic device and has power factor correction (PFC) circuitry that is configured to correct a power factor of the DC power signal, the method comprising:
    causing a controller of the power supply to monitor an amount of correction ($\varphi$) being applied to the DC power signal by the PFC circuitry; and
    causing the controller to shut down supply of power to the electronic device in response to $\varphi$ being within a first threshold of zero degrees for a second threshold amount of time.

14. The method claim 13, comprising:
causing the controller to:
continually determine a moving average of the current drawn by the power supply and compare the moving average to a present current being drawn by the power supply; and
condition the shutting down of the supply of power on whether the present current being supplied to the electronic device exceeds the moving average by a third threshold amount.

15. The method claim 13,
causing the controller to:

continually determine a moving average of the current drawn by the power supply and compare the moving average to a present current being drawn by the power supply;
condition the shutting down of the supply of power on whether the present current being supplied to the electronic device exceeds the moving average by a third threshold amount:
for more than a fourth threshold amount of time, or
more than a fifth threshold number of times within a specified period.

16. The method claim 13,
wherein the second threshold is less than or equal to 10 ms.

17. The method claim 13,
wherein φ corresponds to an amount that a phase of a current waveform has been shifted by the PFC circuitry.

18. The method claim 17,
wherein the first threshold is less than or equal to 2°.

* * * * *